US009097753B2

(12) United States Patent
Raz et al.

(10) Patent No.: US 9,097,753 B2
(45) Date of Patent: Aug. 4, 2015

(54) HALL SENSOR HAVING SERIALLY CONNECTED HALL ELEMENTS

(75) Inventors: Roiy Raz, Freiburg (DE); Patrick Ruther, Karlsruhe (DE); Timo Kaufmann, Freiburg (DE); Oliver Paul, Freiburg (DE)

(73) Assignees: Micronas GmbH, Freiburg (DE); Albert-Ludwigs-Universitaet Freiburg, Freiburg (DE)

( * ) Notice: Subject to any disclaimer, the term of this patent is extended or adjusted under 35 U.S.C. 154(b) by 364 days.

(21) Appl. No.: 13/542,465

(22) Filed: Jul. 5, 2012

(65) Prior Publication Data

US 2013/0015853 A1    Jan. 17, 2013

Related U.S. Application Data

(60) Provisional application No. 61/508,363, filed on Jul. 15, 2011.

(30) Foreign Application Priority Data

Jul. 15, 2011 (DE) .......................... 10 2011 107 767

(51) Int. Cl.
G01R 33/07 (2006.01)
G01R 33/06 (2006.01)

(52) U.S. Cl.
CPC .............. G01R 33/07 (2013.01); G01R 33/066 (2013.01)

(58) Field of Classification Search
CPC ........................................ G01R 33/07–33/077
USPC .......................................................... 324/251
See application file for complete search history.

(56) References Cited

U.S. PATENT DOCUMENTS

| 4,048,670 | A | * | 9/1977 | Eysermans ................... 361/813 |
| 4,829,352 | A | | 5/1989 | Popovic et al. |
| 7,253,490 | B2 | | 8/2007 | Oohira |
| 7,511,484 | B2 | * | 3/2009 | Oohira et al. ................. 324/251 |
| 8,164,149 | B2 | | 4/2012 | Schott |
| 2005/0230770 | A1 | * | 10/2005 | Oohira ......................... 257/421 |
| 2007/0046287 | A1 | * | 3/2007 | Vervaeke et al. ............. 324/251 |

(Continued)

FOREIGN PATENT DOCUMENTS

| DE | 101 50 955 C1 | 6/2003 |
| DE | 10 2005 014 157 A1 | 10/2005 |

(Continued)

OTHER PUBLICATIONS

Machine Translation of DE 10150955 C1.*

(Continued)

*Primary Examiner* — Jay Patidar
(74) *Attorney, Agent, or Firm* — Muncy, Geissler, Olds & Lowe, P.C.

(57) ABSTRACT

A Hall sensor is provided having a first Hall element with a first terminal contact and with a second terminal contact and with a third terminal contact, a second Hall element with a fourth terminal contact and with a fifth terminal contact and with a sixth terminal contact, a third Hall element with a seventh terminal contact and with an eighth terminal contact and with a ninth terminal contact, and a fourth Hall element with a tenth terminal contact and with an eleventh terminal contact and with a twelfth terminal contact. The first Hall element and the second Hall element and the third Hall element and the fourth Hall element are connectable in series.

13 Claims, 2 Drawing Sheets

(56) References Cited

U.S. PATENT DOCUMENTS

2010/0042336 A1* 2/2010 Lee et al. .................. 702/38
2010/0133632 A1 6/2010 Schott
2012/0016614 A1 1/2012 Hohe et al.
2012/0286776 A1* 11/2012 Ausserlechner et al. ..... 324/251
2013/0342194 A1* 12/2013 Motz et al. ................ 324/251

FOREIGN PATENT DOCUMENTS

| | | | |
|---|---|---|---|
| DE | 10 2006 061 883 A1 | 8/2007 | |
| DE | 102006037226 B4 * | 5/2008 | |
| DE | 102011101604 A1 * | 12/2011 | |
| DE | 102011017096 A1 * | 10/2012 | |
| DE | 102011115566 A1 * | 4/2013 | |
| DE | 102012212594 A1 * | 11/2013 | |
| JP | 58154263 A * | 9/1983 | .............. H01L 27/22 |
| JP | 2007-212435 A | 8/2007 | |
| JP | 2008-022022 A | 1/2008 | |
| JP | 2010-500536 A | 1/2010 | |
| JP | 2010-127940 A | 6/2010 | |
| WO | WO 03/036733 A2 | 5/2003 | |

OTHER PUBLICATIONS

Japanese Office Action for Japanese Application No. 2012-156700 dated Jun. 7, 2013 with English translation.

* cited by examiner

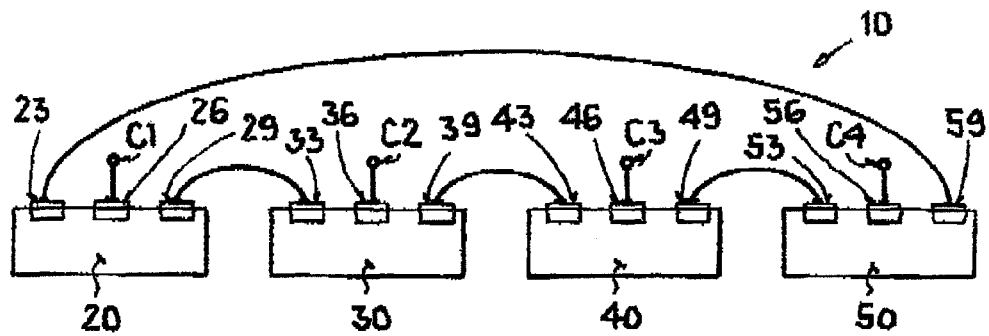
FIG.1
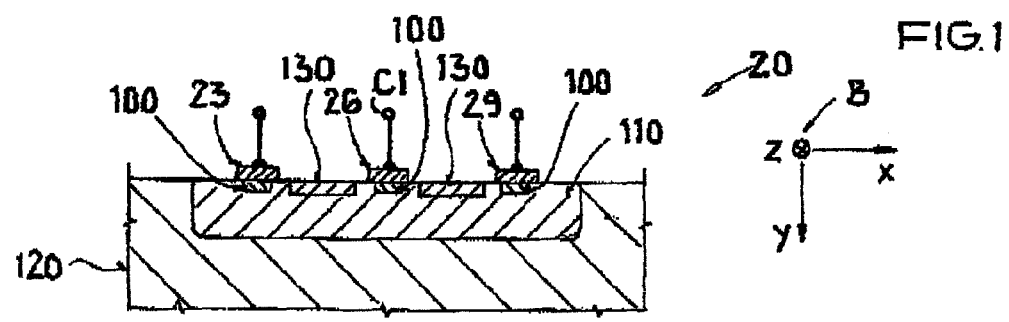
FIG.2
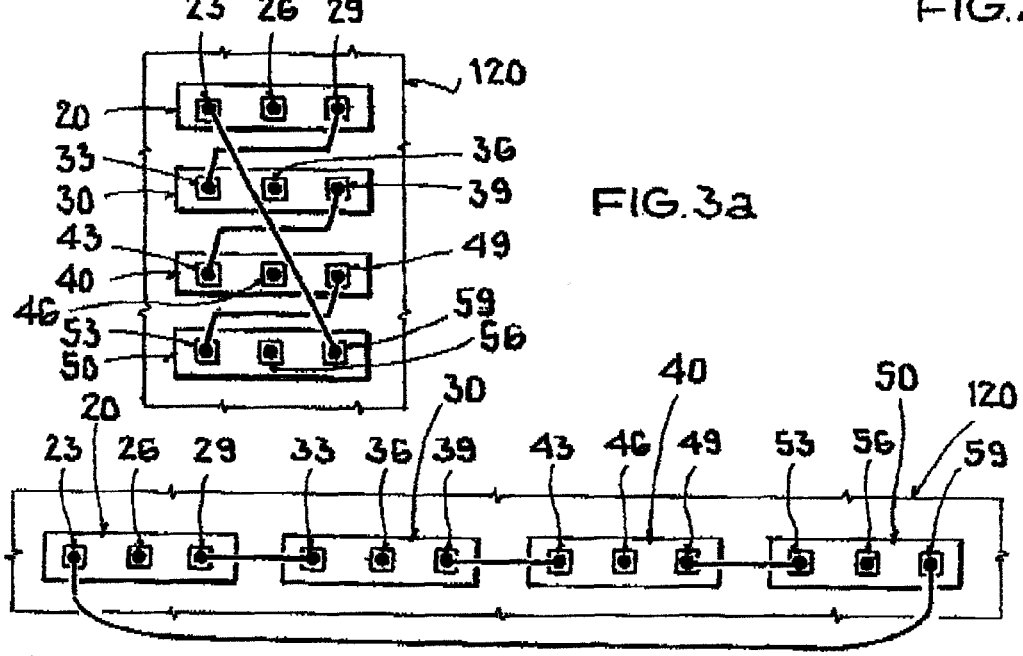
FIG.3a
FIG.3b

HALL SENSOR HAVING SERIALLY CONNECTED HALL ELEMENTS

This nonprovisional application claims priority to German Patent Application No. DE 10 2011 107 767.0, which was filed in Germany on Jul. 15, 2011, and to U.S. Provisional Application No. 61/508,363, which was filed on Jul. 15, 2011, and which are both herein incorporated by reference.

BACKGROUND OF THE INVENTION

1. Field of the Invention

The invention relates to a Hall sensor.

2. Description of the Background Art

DE 101 50 955 C1 discloses a Hall sensor. The Hall sensor has a plurality of vertical Hall elements each with five terminal contacts. In this case, up to four Hall elements are designed parallel to one another and the terminal contacts are connected to one another by means of cyclic commutation, to reduce the offset voltage of the Hall sensor in comparison with the offset voltage of a single Hall element. In addition, the offset voltage can be reduced further by means of the so-called "spinning current" method. It is desirable to improve the complex arrangement, the offset, and the power consumption of the Hall sensor.

SUMMARY OF THE INVENTION

It is therefore an object of the invention to provide a device that refines the state of the art.

According to an embodiment, a Hall sensor is provided, having a first Hall element with a first terminal contact and with a second terminal contact and with a third terminal contact, a second Hall element with a fourth terminal contact and with a fifth terminal contact and with a sixth terminal contact, a third Hall element with a seventh terminal contact and with an eighth terminal contact and with a ninth terminal contact, and a fourth Hall element with a tenth terminal contact and with an eleventh terminal contact and with a twelfth terminal contact, whereby the first Hall element and the second Hall element and the third Hall element and the fourth Hall element are connected in series. It should be noted that the Hall sensor has four Hall elements connected in series to one another.

In this regard, each of the four Hall elements has a middle terminal contact and at least two terminal contacts arranged around the middle terminal contact. The terminal contacts, arranged around the middle terminal contact, of a Hall element are connected to the terminal contacts, arranged around the middle terminal contact, of the next Hall element. It is preferred in this respect to generate a closed ring by means of the interconnection; i.e., the last Hall element in the series is connected to the first Hall element of the series. The formed Hall sensor as a result has four terminal contacts, whereby the four terminal contacts are formed by the four middle terminal contacts of the individual Hall elements.

An advantage of the device of the invention is that it is possible to reduce the offset voltage of the Hall sensor by the inventive connection of four individual Hall elements with three contacts in each case. To this end, the series connection of the four Hall elements is operated preferably in four different modes according to the so-called "spinning current" method and the offset voltages of the individual modes are added to form a total offset voltage. Tests by the applicant have shown that the total offset voltage is substantially smaller than the offset voltage of a single vertical Hall element with five contacts, operated by the "spinning current" method, and surprisingly is almost zero. A complex parallel connection of a plurality of Hall sensors becomes unnecessary due to the fact that the offset voltage is already almost zero.

The new sensor concept is notable in that a similar combination of control current distributions is achieved in the individual Hall elements in all four modes. In a single Hall element with five contacts, the control current distribution is different between the individual modes. Tests have shown that Hall elements each with, for example, five contacts can also be used according to the series connection of the invention. In this respect, preferably the inner three contacts are to be used. Further, Hall elements with four contacts, with six contacts, or accordingly more than six contacts can be connected according to the series connection of the invention.

A further advantage is that the contact and interconnect resistances in the series connection of the four Hall elements can be distributed symmetrically and are virtually the same in value in all modes. As a result, the offset voltages of the individual modes are opposite and equal in value in the first approximation.

It can be understood that the four Hall elements of the Hall sensor have a current-carrying surface to generate a Hall voltage, the normal vector of the surface being designed parallel to the direction of the component, to be measured, of the magnetic field penetrating the surface. Further, the offset voltage is to be measured preferably in the absence of a magnetic field. This type of measurement cycle is also called calibration.

In another embodiment, the second terminal contact and the fifth terminal contact and the eighth terminal contact and the eleventh terminal contact are each formed as supply voltage terminals or as Hall voltage taps. In this respect, the sign of the Hall voltage, to be measured, depends on the direction of the current flow, the direction of the applied magnetic field, and the doping of the semiconductor regions in which the Hall elements are formed. In another embodiment the first terminal contact is connected to the twelfth terminal contact to form the series connection. In another embodiment, the third terminal contact is connected to the fourth terminal contact and the sixth terminal contact to the seventh terminal contact and the ninth terminal contact to the tenth terminal contact. The four modes, i.e., mode 1 through mode 4, for operating the Hall sensor are listed in Table 1 by way of illustration. Here, the designations C1 to C4 indicate the middle contact of the individual Hall elements, VB1, VB2 the two operating voltages, and VH1 and VH2 the two measuring voltages, the difference between the two measuring voltages also being called the Hall voltage.

TABLE 1

|  | C1 | C2 | C3 | C4 |
| --- | --- | --- | --- | --- |
| Mode 1 (M1) | VB1 | VH1 | VB2 | VH2 |
| Mode 2 (M2) | VB2 | VH2 | VB1 | VH1 |
| Mode 3 (M3) | VH2 | VB1 | VH1 | VB2 |
| Mode 4 (M4) | VH1 | VB2 | VH2 | VB1 |

In an embodiment, in the case of the first Hall element up to and including the fourth Hall element, the three terminal contacts are each arranged on a straight line and the straight lines are arranged preferably parallel to one another; i.e., the Hall elements are arranged parallel to one another. According to a refinement, the terminal contacts of the first Hall element up to and including the fourth Hall element are arranged on a common straight line. In particular, it is preferred to form the first Hall element up to and including the fourth Hall element each as vertical Hall elements. It should be noted that it is preferred to select the trace resistances for connecting the individual Hall elements to one another to be as similar as possible.

Tests by the applicant have shown that it is expedient when the first Hall element and the second Hall element and the third Hall element and the fourth Hall element are arranged on a semiconductor body and an integrated circuit is formed on the semiconductor body. As a result, a control circuit, formed as part of the integrated circuit and having a functional connection with the Hall sensor, and an evaluation circuit can be monolithically integrated. It should be noted that the term functional connection is also understood, inter alia, to be an electrical connection between the integrated circuit and the Hall sensor. It is preferred further to arrange the first Hall element and the second Hall element and the third Hall element and the fourth Hall element and the integrated circuit in a single common housing and preferably to connect them to one another electrically.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 1 shows a schematic view of an embodiment of a series connection, according to the invention, of four Hall elements of a Hall sensor;

FIG. 2 shows a schematic cross section of an embodiment of a single Hall element of FIG. 1;

FIG. 3*a* shows a first possible geometric arrangement of the four Hall elements of FIG. 1;

FIG. 3*b* shows a second possible geometric arrangement of the four Hall elements of FIG. 1.

DETAILED DESCRIPTION

Figure 4:
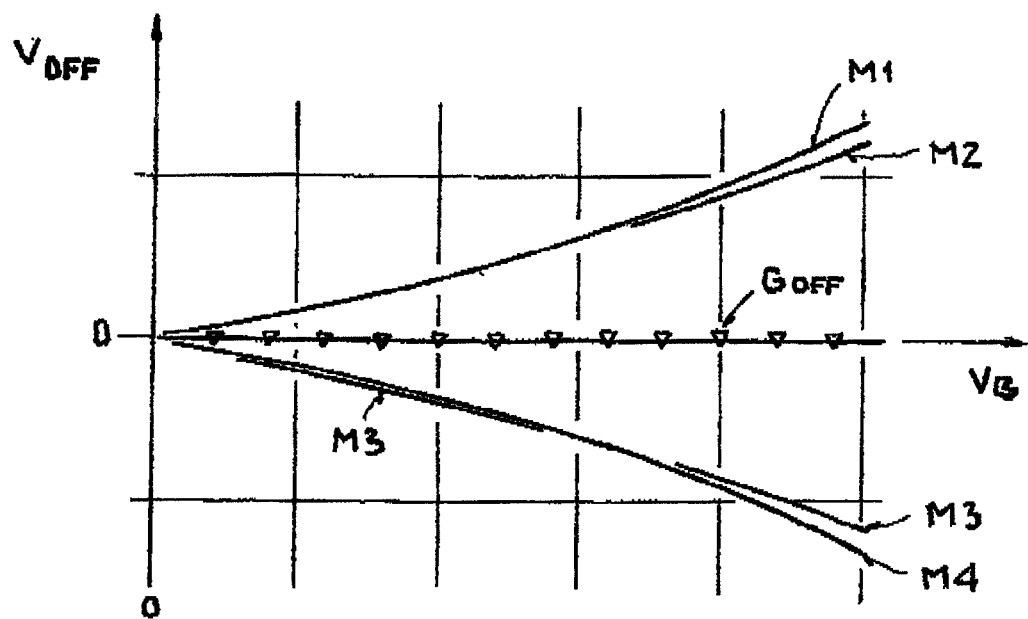
FIG. 4 shows a schematic illustration of the relationship between the offset voltage and an applied supply voltage for an n-doped Hall sensor in the four modes.

The illustration in FIG. 1 shows a schematic view of an embodiment of a series connection, according to the invention, of a Hall sensor 10, having a first preferably vertically formed Hall element 20, with a first terminal contact 23, a second terminal contact 26, and a third terminal contact 29, a second preferably vertically formed Hall element 30, with a fourth terminal contact 33, a fifth terminal contact 36, and a sixth terminal contact 39, a third preferably vertically formed Hall element 40, with a seventh terminal contact 43, an eighth terminal contact 46, and a ninth terminal contact 49, and a fourth preferably vertically formed Hall element 50, with a tenth terminal contact 53, an eleventh terminal contact 56, and a twelfth terminal contact 59. Furthermore, first terminal contact 23 is connected to twelfth terminal contact 59. Depending on the mode, according to the arrangement in Table 1, second terminal contact 26 is formed with a first connection point C1 and the fifth terminal contact 36 with a second connection point C2 and the eighth terminal contact 46 with a third connection point C3 and the eleventh terminal contact 56 with a fourth connection point C4, in each case as supply voltage terminals or as Hall voltage taps. Depending on the mode, a supply voltage VB1 or a reference potential VB2 different therefrom is applied at the first to fourth connection points or a Hall voltage VH1 or a Hall voltage VH2 is measured.

A schematic cross section of an embodiment of an individual Hall element using the example of first Hall element 20 of FIG. 1 is shown in FIG. 2. Only the differences relative to the embodiment shown in FIG. 1 will be described below. Immediately below the first terminal contact 23 up to and including the third terminal contact 29, a heavily doped n-contact region 100 is formed, to connect the individual terminal contacts 23 to 29 in a low-impedance manner to a lightly doped n-well region 110. n-Well region 110 is formed within a semiconductor body 120. An isolation region 130, preferably having oxide or a highly doped $p^+$ diffusion, is formed in each case between the individual n-contact regions. Semiconductor body 120 is preferably formed as a p-substrate. Preferably, the n-well region has phosphorus doping and the n-contact region preferably has a higher phosphorus doping than the n-well region. By contrast, the p-substrate has a boron doping.

According to the illustrated embodiment in FIG. 2, the direction of a magnetic field to be measured points in a z-direction, i.e., into or out of the plane of the drawing, whereas the first Hall element 20 is formed in the x-y plane.

A first possible geometric arrangement of the four Hall elements of FIG. 1 is shown in the illustration in FIG. 3*a*. Only the differences relative to the embodiment shown in FIG. 1 will be described below. In the case of first Hall element 20 up to and including the fourth Hall element 50, in each case the three terminal contacts are arranged on a straight line (not drawn), whereby the individual straight lines are arranged substantially parallel to one another.

A second possible geometric arrangement of the four Hall elements of FIG. 1 is shown in the illustration in FIG. 3*b*. Only the differences relative to the embodiment shown in FIG. 1 will be described below. Accordingly, now all terminal contacts of the first Hall element up to and including the fourth Hall element are arranged on a common straight line (not drawn).

In the illustration of FIG. 4, a schematic representation of the relationship between an offset voltage VOFF=VH1−VH2 without an influence of a magnetic field and an applied supply voltage VB=VB1−VB2 for an n-doped Hall sensor is shown. It should be noted that it is advantageous to determine the offset voltage during a so-called calibration phase in the absence of the magnetic field. According to an alternative approach, the offset voltage can be eliminated by means of the so-called "spinning current" method very largely independent of a magnetic field. In this way, the resulting measuring signal, i.e., the Hall voltage, is already very largely preferably completely free of the offset voltage. It is clear that the measured offset voltage VOFF in a first mode M1 or a second mode M2 or a third mode M3 or a fourth mode M4 is positive or negative, and after the addition of the offset voltages for the individual modes, the total offset voltage GOFF calculated on the basis of averaging, shown by the triangular symbols, virtually forms a straight line with the slope of zero.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A Hall sensor comprising:
a first Hall element with a first terminal contact, a second terminal contact, and a third terminal contact;
a second Hall element with a fourth terminal contact, a fifth terminal contact, and a sixth terminal contact;
a third Hall element with a seventh terminal contact, an eighth terminal contact, and a ninth terminal contact; and
a fourth Hall element with a tenth terminal contact, an eleventh terminal contact, and a twelfth terminal contact;
wherein each of the first, second, third and fourth Hall elements has at least two terminal contacts arranged around a middle terminal contact,
wherein only the terminal contacts arranged around the middle terminal contact are connected to the terminal contacts arranged around the middle terminal contact of the next Hall element so that the first Hall element, the second Hall element, the third Hall element and the fourth Hall element are connected in series,
wherein the middle terminal contact of each of the first, second, third and fourth Hall elements is free from being connected to the middle terminals of other Hall elements, and
wherein the first terminal contact is directly connected to the twelfth terminal contact.

2. The Hall sensor according to claim 1, wherein the second terminal contact, the fifth terminal contact, the eighth terminal contact and the eleventh terminal contact are each formed as supply voltage terminals or as Hall voltage taps.

3. The Hall sensor according to claim 1, wherein the third terminal contact is connected to the fourth terminal contact, the sixth terminal contact is connected to the seventh terminal contact, and the ninth terminal contact to the tenth terminal contact.

4. The Hall sensor according to claim 1, wherein, in each of the first Hall element to the fourth Hall element, the three terminal contacts are arranged on a straight line and the straight lines of the first Hall element to the fourth Hall element are arranged parallel to one another.

5. The Hall sensor according to claim 1, wherein the terminal contacts of the first Hall element to the fourth Hall element are arranged on a common straight line.

6. The Hall sensor according to claim 1, wherein the first Hall element to the fourth Hall element are each formed as vertical Hall elements in a semiconductor body.

7. The Hall sensor according to claim 6, wherein an integrated circuit is formed on the semiconductor body.

8. The Hall sensor according to claim 7, wherein the first Hall element, the second Hall element, the third Hall element and the fourth Hall element and the integrated circuit are connected electrically and are arranged in a single common housing.

9. The Hall sensor according to claim 1, wherein the terminal contacts arranged around the middle terminal contact on the first Hall element are respectively connectable to only the fourth terminal contact of the second Hall element and the twelfth terminal contact of the fourth Hall element.

10. The Hall sensor according to claim 1, wherein the terminal contacts arranged around the middle terminal contact on the second Hall element are respectively connectable to only the third terminal contact of the first Hall element and the seventh terminal contact of the third Hall element.

11. The Hall sensor according to claim 1, wherein the terminal contacts arranged around the middle terminal contact on the third Hall element are respectively connectable to only the sixth terminal contact of the second Hall element and the tenth terminal contact of the fourth Hall element.

12. The Hall sensor according to claim 1, wherein the terminal contacts arranged around the middle terminal contact on the fourth Hall element are respectively connectable to only the ninth terminal contact of the third Hall element and the first terminal contact of the first Hall element.

13. A Hall sensor comprising:
a first Hall element with a first terminal contact, a second terminal contact, and a third terminal contact;
a second Hall element with a fourth terminal contact, a fifth terminal contact, and a sixth terminal contact;
a third Hall element with a seventh terminal contact, an eighth terminal contact, and a ninth terminal contact; and
a fourth Hall element with a tenth terminal contact, an eleventh terminal contact, and a twelfth terminal contact;
wherein each of the first, second, third and fourth Hall elements has at least two terminal contacts arranged around a middle terminal contact,
wherein only the terminal contacts arranged around the middle terminal contact are connected to the terminal contacts arranged around the middle terminal contact of the next Hall element so that the first Hall element, the second Hall element, the third Hall element and the fourth Hall element are connected in series,
wherein the second terminal contact, the fifth terminal contact, the eighth terminal contact and the eleventh terminal contact are each formed as supply voltage terminals or as Hall voltage taps, and
wherein the first terminal contact is directly connected to the twelfth terminal contact.

* * * * *

UNITED STATES PATENT AND TRADEMARK OFFICE
CERTIFICATE OF CORRECTION

PATENT NO. : 9,097,753 B2
APPLICATION NO. : 13/542465
DATED : August 4, 2015
INVENTOR(S) : Raz et al.

It is certified that error appears in the above-identified patent and that said Letters Patent is hereby corrected as shown below:

On the title page item (75), Inventors: Roiy Raz, Freiburg (DE); Patrick Ruther, Karlsruhe (DE); Timo Kaufmann, Freiburg (DE); Oliver Paul, Freiburg (DE)

should read:

Inventors: Roiy Raz, Freiburg (DE); Patrick Ruther, Karlsruhe (DE); Timo Kaufmann, Freiburg (DE); Oliver Paul, Au (DE)

Signed and Sealed this
Seventeenth Day of May, 2016

Michelle K. Lee
*Director of the United States Patent and Trademark Office*